United States Patent [19]
Khoury et al.

[11] Patent Number: 5,959,492
[45] Date of Patent: Sep. 28, 1999

[54] HIGH SPEED DIFFERENTIAL DRIVER CIRCUITRY AND METHODS FOR IMPLEMENTING THE SAME

[75] Inventors: Elie Georges Khoury, Gilbert; Karl Heinz Mauritz, Mesa, both of Ariz.

[73] Assignee: VLSI Technology, Inc., San Jose, Calif.

[21] Appl. No.: 08/961,648

[22] Filed: Oct. 31, 1997

[51] Int. Cl.[6] .............................. H03F 3/45; H03F 3/16
[52] U.S. Cl. ......................... 327/389; 327/180; 327/333; 327/374; 330/253; 330/258; 326/68; 326/81
[58] Field of Search .............................. 327/52, 165, 178, 327/180, 323, 333, 374, 376, 379, 389, 560, 563; 330/252, 253, 258, 259, 260, 261; 326/17, 62, 68, 80, 81, 86

[56] References Cited

U.S. PATENT DOCUMENTS

| | | | |
|---|---|---|---|
| 3,946,325 | 3/1976 | Leidich | 330/258 |
| 3,959,733 | 5/1976 | Solomon et al. | 330/258 |
| 4,059,809 | 11/1977 | Sichart | 330/253 |
| 4,105,942 | 8/1978 | Henry | 330/69 |
| 4,272,728 | 6/1981 | Wittlinger | 330/258 |
| 4,616,189 | 10/1986 | Pengue, Jr. | 330/258 |
| 4,996,498 | 2/1991 | Hanna | 330/258 |
| 5,105,107 | 4/1992 | Wilcox | 326/68 |
| 5,187,448 | 2/1993 | Brooks et al. | 330/258 |
| 5,191,581 | 3/1993 | Woodbury et al. | 370/364 |
| 5,216,297 | 6/1993 | Proebsting | 326/73 |
| 5,298,809 | 3/1994 | Yamaguchi | 330/258 |
| 5,313,118 | 5/1994 | Lundberg | 326/86 |
| 5,418,478 | 5/1995 | Van Brunt et al. | 326/86 |
| 5,754,059 | 5/1998 | Tanghe et al. | 326/77 |

*Primary Examiner*—Timothy P. Callahan
*Assistant Examiner*—Terry L. Englund
*Attorney, Agent, or Firm*—Martine Penilla & Kim, LLP

[57] ABSTRACT

An integrated circuit driver drives a differential signal over a communication cable, such as a twisted-pair cable. The integrated circuit driver includes a differential pre-driver that receives an input signal having an about 50% duty cycle and produces an amplified differential signal that swings between a power rail level and a ground level. A signal conditioner circuit receives the amplified differential signal and outputs a conditioned differential signal. The conditioned differential signal swings between the power rail level and an intermediate power level. The integrated circuit driver further includes an output driver that receives the conditioned differential signal that swings between the power rail level and the intermediate power level. The output driver produces a differential output signal that is communicated to the communication cable. The differential output signal has an about zero signal crossing and maintains the about fifty percent duty cycle.

19 Claims, 12 Drawing Sheets

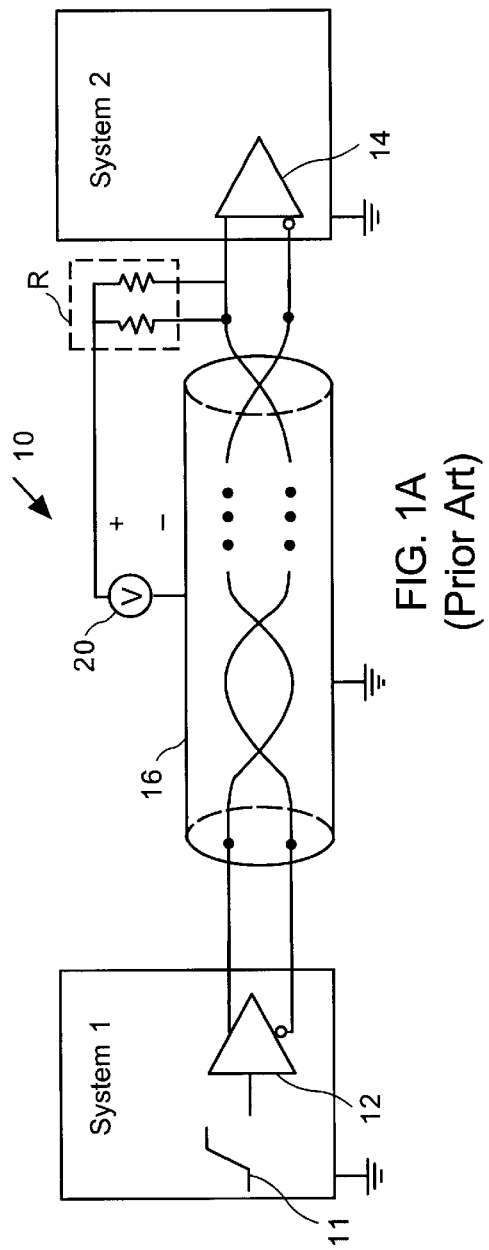
FIG. 1A (Prior Art)
FIG. 1B (Prior Art)
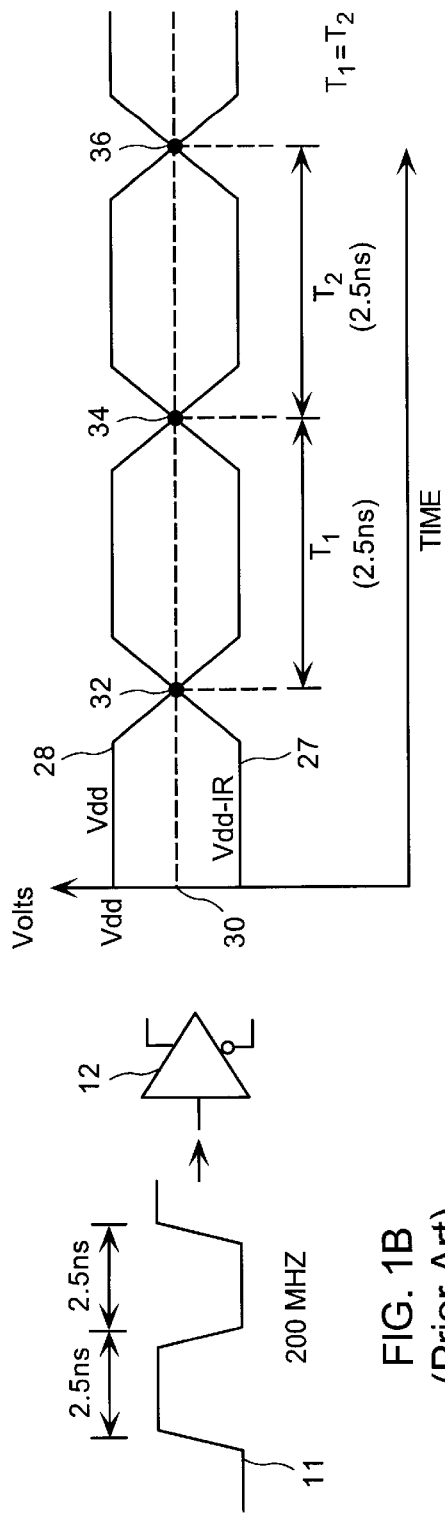
FIG. 1C (Ideal Output)

| Transistor 128 | | ON | | |
|---|---|---|---|---|
| Node S Common Mode V | Node 120 | | (Gate) | Node 160 (Drain) |
| 1.2 V | | | 3 V Vdd / ON (Strong) | 2.3 V |
| Transistor 130 | | OFF | | |
| Node S Common Mode V | Node 122 | | (Gate) | Node 162 (Drain) |
| 1.2 V | 3 V Vdd / ON (Strong) | 2.3 V / OFF (Weakly) | 1.2 V / OFF | 0 V Vss / OFF (Strong) | 2.3 V |

FIG. 3D

| Transistor 128 | | OFF | | |
|---|---|---|---|---|
| Node S Common Mode V | Node 120 | | (Gate) | Node 160 (Drain) |
| 1.2 V | 0V Vss / OFF (Strong) | 1.2 V / OFF | 2.3 V / OFF (Weakly) | 3 V Vdd / ON (Strong) | 2.3 V |
| Transistor 130 | | ON | | |
| Node S Common Mode V | Node 122 | | (Gate) | Node 162 (Drain) |
| 1.2 V | 3 V Vdd / ON (Strong) | | | | 2.3 V |

FIG. 3E

HIGH SPEED DIFFERENTIAL DRIVER CIRCUITRY AND METHODS FOR IMPLEMENTING THE SAME

BACKGROUND OF THE INVENTION

1. Field of the Invention

The present invention relates generally to communication circuits and, more particularly, to integrated circuits for differentially driving data over a communication cable.

2. Description of the Related Art

In recent years, there has been a continual push to increase data transfer rates between computers, and between computers and peripheral devices. To meet the demand for higher speed links, many designers have been using twisted-pair or twin-x shielded cables to complete a high speed link. An advantage of using twisted-pair or twin-x shielded cables is that they maintain good signal integrity, and therefore, have low noise characteristics and are less susceptible to cross talk. Although these cables have these advantages, the integrated circuits that drive the differential signals over the twisted-pair cables to a differential receiver have been found to generate unacceptable differential signal waveforms.

For ease of discussion, FIG. 1A is a simplified diagram of a serial data transmission system 10. The serial data transmission system 10 includes a system 1, that may be a semiconductor chip that has a conventional differential driver 12 for communicating an input signal 11 over a twisted-pair cable 16. As shown, the twisted-pair cable 16 is coupled to a system 2, which has a differential receiver 14. In this example, the twisted-pair cable 16 is a current carrying system, that is coupled to ground and a voltage source 20. Voltage source 20 is then coupled to a termination load "R", which is connected to the input of the differential receiver 14.

FIG. 1B shows the input signal 11 having a period of about 5 nanoseconds in a 200 MHz signal, which is provided to the differential driver 12. In an ideal situation, the output of the differential driver 12 would produce a differential signal 27 and 28 having a zero signal crossing at a voltage level 30, a 50% duty cycle, and equal rise and fall slew rates as shown in FIG. 1C. The ideal differential output signal 27 and 28 has a $T_1$ and a $T_2$ that are equal (i.e., $T_1=T_2=2.5$ ns), representing a 50% duty cycle, and signals 27 and 28 crossing halfway between "Vdd" and "Vdd−IR". Specifically, the zero signal crossing occurs at a point 32, a point 34, a point 36, etc. Unfortunately, conventional differential drivers 12 are not well optimized to produce the ideal output illustrated in FIG. 1C. That is, conventional differential drivers 12 have been found to produce output signals with substantial jitter, and therefore, do not produce a zero signal crossing, fail to produce a 50% duty cycle, and have unequal rise and fall slew rates.

For example, conventional differential drivers 12 may produce a differential signal 27' and 28' having a signal crossing at points 32', 34' and 36' as shown in FIG. 1D. However, the signal crossings are offset from the zero signal crossing point 30. That is, the signal crossing point 32' is offset from the zero signal crossing point 30 by an offset 37. Similarly, crossing point 34' is offset from the zero signal crossing 30 by an offset 38. Furthermore, the differential signal produced by the differential driver 12 does not produce a 50% duty cycle or equal rise and fall slew rates. Consequently, when the differential signal produced by the differential driver 12 lacks good signal integrity, a substantial amount of jitter will be communicated to the differential receiver 14. As a result, the differential receiver 14 and its associated receiver circuitry will require substantially more time to decipher whether a received signal is a digital 1 or a digital 0. In fact, if the jitter is large enough, the differential receiver 14 may introduce errors in the received data.

FIG. 1E shows a prior art phase lock loop (PLL) 50 that receives a system clock to enable detection of the incoming signal in conjunction with a serial-to-parallel converter 52. If the signal that is being received by the differential receiver 14 and passed to the serial-to-parallel converter 52 has a substantial amount of jitter, the receiving system will require more time to ascertain the digital level being received over the twisted-pair cable 16. As can be appreciated, because the receiving circuitry is required to work harder to accurately read the incoming signals generated by the differential driver 12, the system as a whole may find it difficult to function at higher speeds.

In view of the foregoing, there is a need for a high speed differential driver that can accurately produce a zero signal crossing, a 50% duty cycle, and equal rise and fall slew rates.

SUMMARY OF THE INVENTION

Broadly speaking, the present invention fills these needs by providing differential driver circuitry including signal conditioner circuitry that accurately generates high speed differential signal outputs that have a zero signal crossing, a 50% duty cycle, and equal rise and fall slew rates. It should be appreciated that the present invention can be implemented in numerous ways, including as a process, an apparatus, a system, a device, or a method. Several inventive embodiments of the present invention are described below.

In one embodiment, an integrated circuit driver for driving a differential signal is disclosed. The integrated circuit driver includes a differential pre-driver that is configured to produce an amplified differential signal that swings between a power rail level and a ground level. A signal conditioner circuit is configured to receive the amplified differential signal and output a conditioned differential signal. The conditioned differential signal swings between the power rail level and an intermediate power level. The integrated circuit driver further includes an output driver that receives the conditioned differential signal that swings between the power rail level and the intermediate power level. The output driver produces a differential output signal that is communicated to a communication cable. The differential output signal has an about zero signal crossing, an about fifty percent duty cycle, and an about equal rise and fall slew rate.

In another embodiment, a method for driving a signal over a communication link is disclosed. The method includes receiving the signal that is to be communicated over the communication link. The signal is then differently drive to produce a differential signal that swings between a high voltage level and a ground voltage level. The differential signal is then conditioned to produce a conditioned differential signal that swings between the high voltage level and an intermediate voltage level that is above the ground voltage level. The method further includes differentially driving the conditioned differential signal to produce an output differential signal that has an about zero signal crossing, an about fifty percent duty cycle, and an about equal rise and fall slew rate.

In yet another embodiment, a system for differentially driving a signal over a twisted-pair cable is disclosed. The system includes means for differentially driving the signal to produce a differential signal that swings between a high voltage level and a ground voltage level. This differential signal is provided to a means for conditioning the differential signal to produce a conditioned differential signal that swings between the high voltage level and an intermediate voltage level that is above the ground voltage level. The system further includes means for differentially driving the conditioned differential signal to produce an output differential signal that has an about zero signal crossing, an about fifty percent duty cycle, and an about equal rise and fall slew rate.

Advantageously, it should be apparent to those skilled in the art of differential drivers that the output differential signal that has an about zero signal crossing, about 50% duty cycle, and equal rise and fall slew rates will substantially increase the speed and accuracy of a communications system. Further yet, because the differential driver produces output signals with excellent integrity, differential receivers will be able to more accurately and rapidly process received signal data. Accordingly, the inventive driver design 200/200' of FIGS. 3A and 3B enable designers to achieve very tight tolerances, at high speeds, by automatically conditioning the differential output drivers' (NMOS) control signals (gate) for fast device switching (i.e., turn on and off). The signal conditioner further buffers the filtered output voltage (i.e., Vs) provided at the output current source, and feeds it back as a voltage source to an intermediate pre-driver in a signal conditioner circuitry 150 (of FIG. 2). The signal conditioner circuitry 150 is then configured to generate low swing control signals, that assist in keeping the differential output driver away from a deep turn off state. In this preferred embodiment, the signal conditioner circuitry 150 is configured to accept rail-to-rail differential signals (i.e., 113a and 113b). Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

FIG. 1A through 1E illustrate conventional techniques and the problems that are associated with driving differential signals over a twisted-pair cable.

FIGS. 3D and 3E are exemplary voltage tables that illustrate the switching voltages of transistors contained in the output driver shown in FIG. 3C in accordance with one embodiment of the present invention.

DETAILED DESCRIPTION OF THE PREFERRED EMBODIMENTS

An invention for differential driver circuitry including signal conditioner circuitry that accurately generates high speed differential signal outputs that have a zero signal crossing, a 50% duty cycle, and equal rise and fall slew rates is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1D:
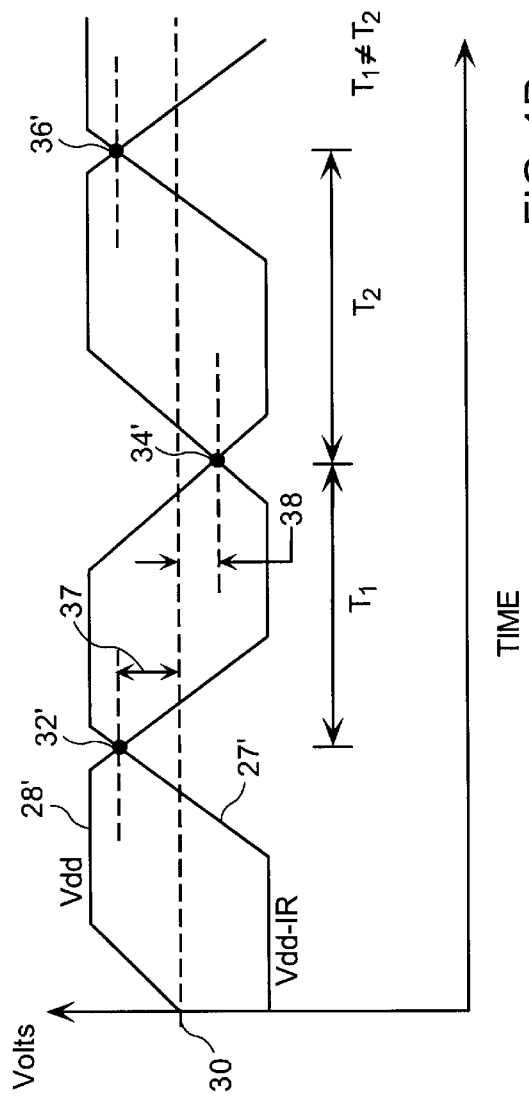
Figure 1E:
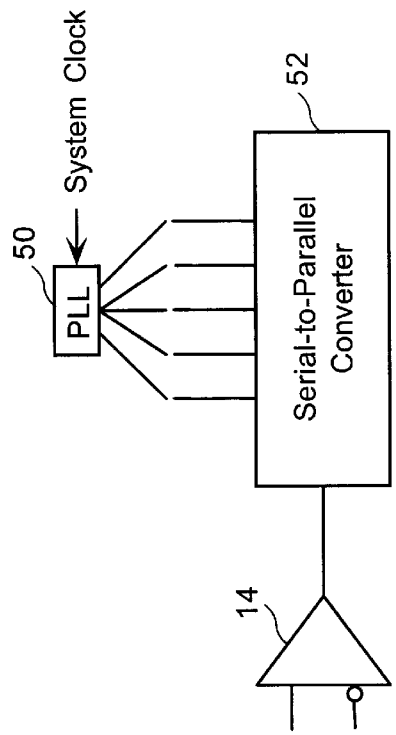
Figure 2:
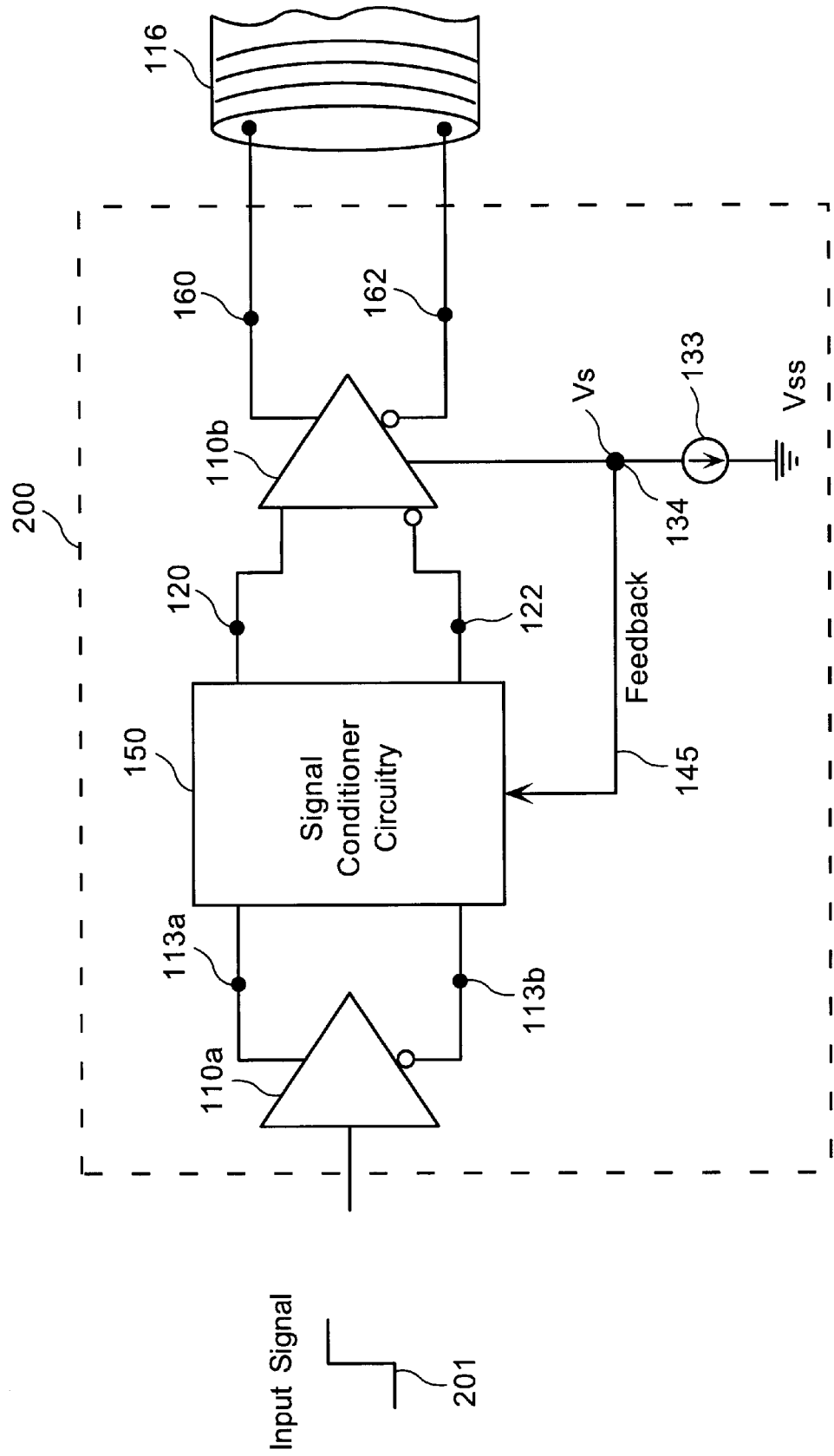
FIG. 2 is a circuit diagram of a high speed differential driver in accordance with one embodiment of the present invention.

FIG. 2 is a circuit diagram of a high speed differential driver 200 in accordance with one embodiment of the present invention. The high speed differential driver 200 is configured to receive an input signal 201 at a differential pre-driver 110a. Differential pre-driver 110a is then configured to produce an amplified differential signal 113a and 113b which is fed into a signal conditioner circuitry 150. Signal conditioner circuitry 150 is configured to receive a feedback signal 145, and then output a conditioned differential signal 120 and 122. Conditioned differential signal 120 and 122 is then passed to an output driver 110b.

Figure 5A:
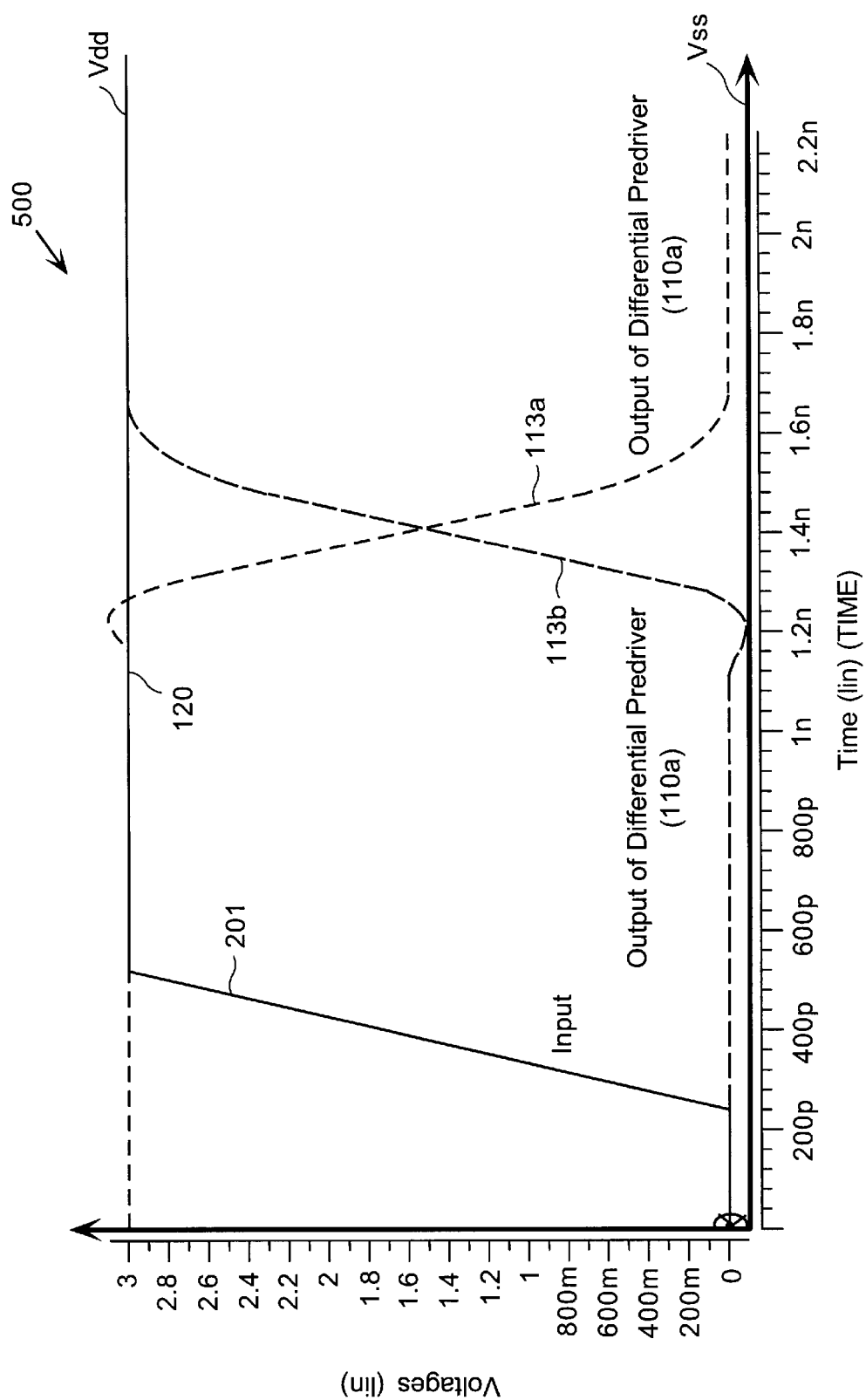
FIG. 5A is a graphical representation of an input signal and differential voltage signals that are output by a differential pre-driver in accordance with one embodiment of the present invention.

The output driver 110b is configured to produce a differential output signal 160 and 162, which is coupled to a twisted-pair cable 116. The output driver 110b is shown providing a feedback voltage signal from a node 134 (that defines voltage Vs), which is coupled to a current source 133. As will be described in greater detail below, the signal conditioner circuitry 150 is configured to receive differential signals 113a and 113b that swing between a Vss voltage level and a Vdd voltage level (as shown in FIG. 5A below). In response to the feedback voltage signal 145, the signal conditioner circuitry 150 will produce the conditioned differential output signal 120 and 122 that swings between a voltage (i.e., an intermediate voltage) that lies between "Vs" (i.e., a common mode voltage at a node S that lies within the output driver 110b) and "Vdd–IR" (which is the voltage drop across the load).

In one embodiment, if Vdd is 3 volts, a termination load of the twisted-pair cable 116 is 75 ohms, and the current source 133 is a 9.5 milli-amp current source, then Vdd—IR=3–(75)(0.0095)=2.3 volts. As will be described in greater detail below with reference to FIG. 3C, Vs will be, in this example, 1.2 volts at a node 134. However, because the output driver 110b is a differential driver, the voltage Vs (i.e., common mode voltage transitions) will be filtered within the signal conditioning circuitry 150. Thus, voltage signal 145 is actually the Vs signal that will be passed through a low pass filter contained in the signal conditioner circuitry 150.

In accordance with this example, the differential signal 120 and 122 will therefore swing between about 3 volts and about 1.8 volts (i.e., 1.8 volts is between 2.3 volts and 1.2 volts). The graphical representation of the differential signal 120 and 122 is provided in FIGS. 5B and 5C below. Of course, it should be appreciated that the voltage levels provided above are only example voltage levels (i.e., 3V may actually be 3.3 V), and the actual voltage levels may vary widely depending on the particular circuit application and design specification.

Figure 5B:
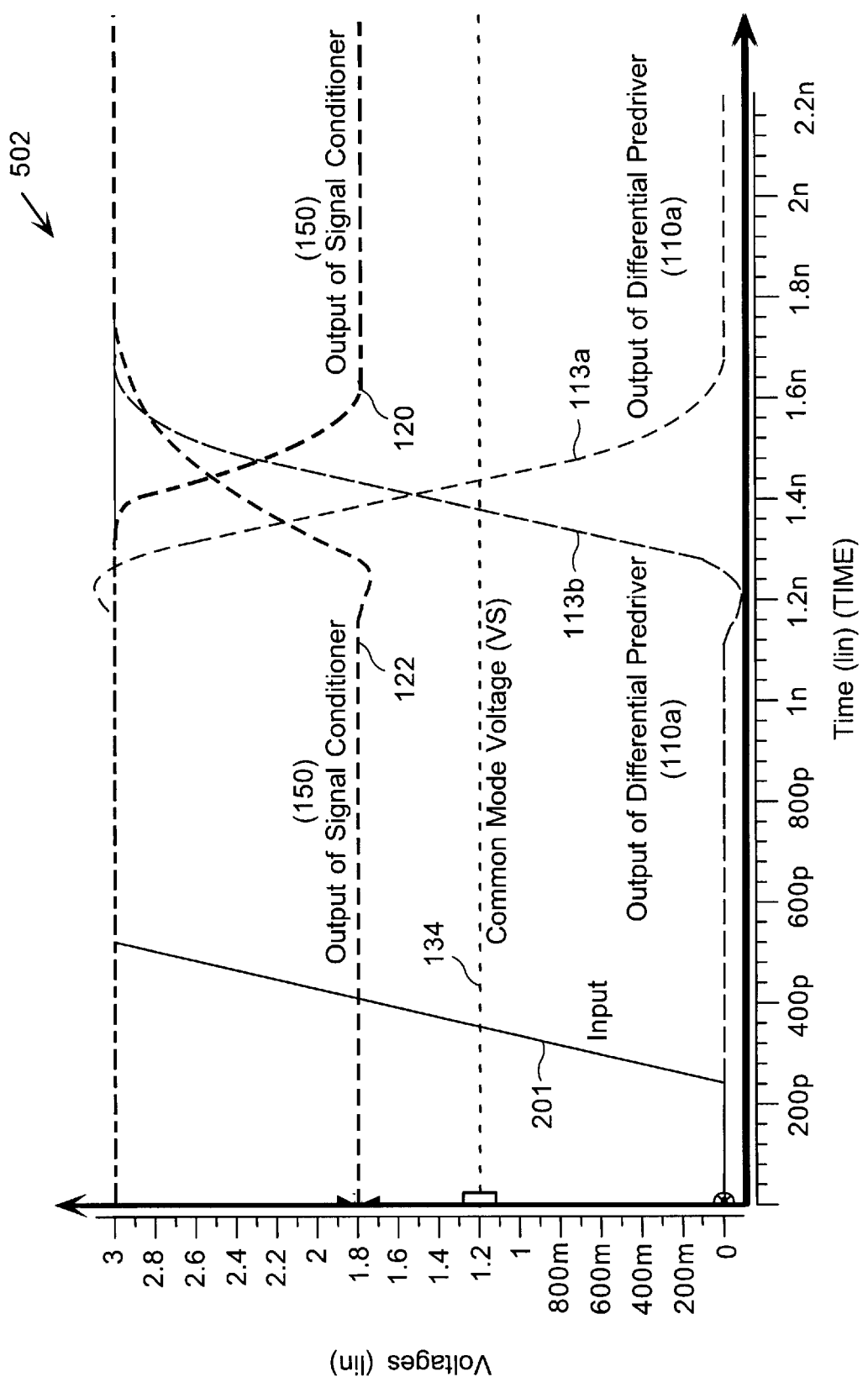
FIG. 5B shows a graphical representation of a voltage level at a common mode voltage (Vs) in accordance with one embodiment of the present invention.
Figure 5C:
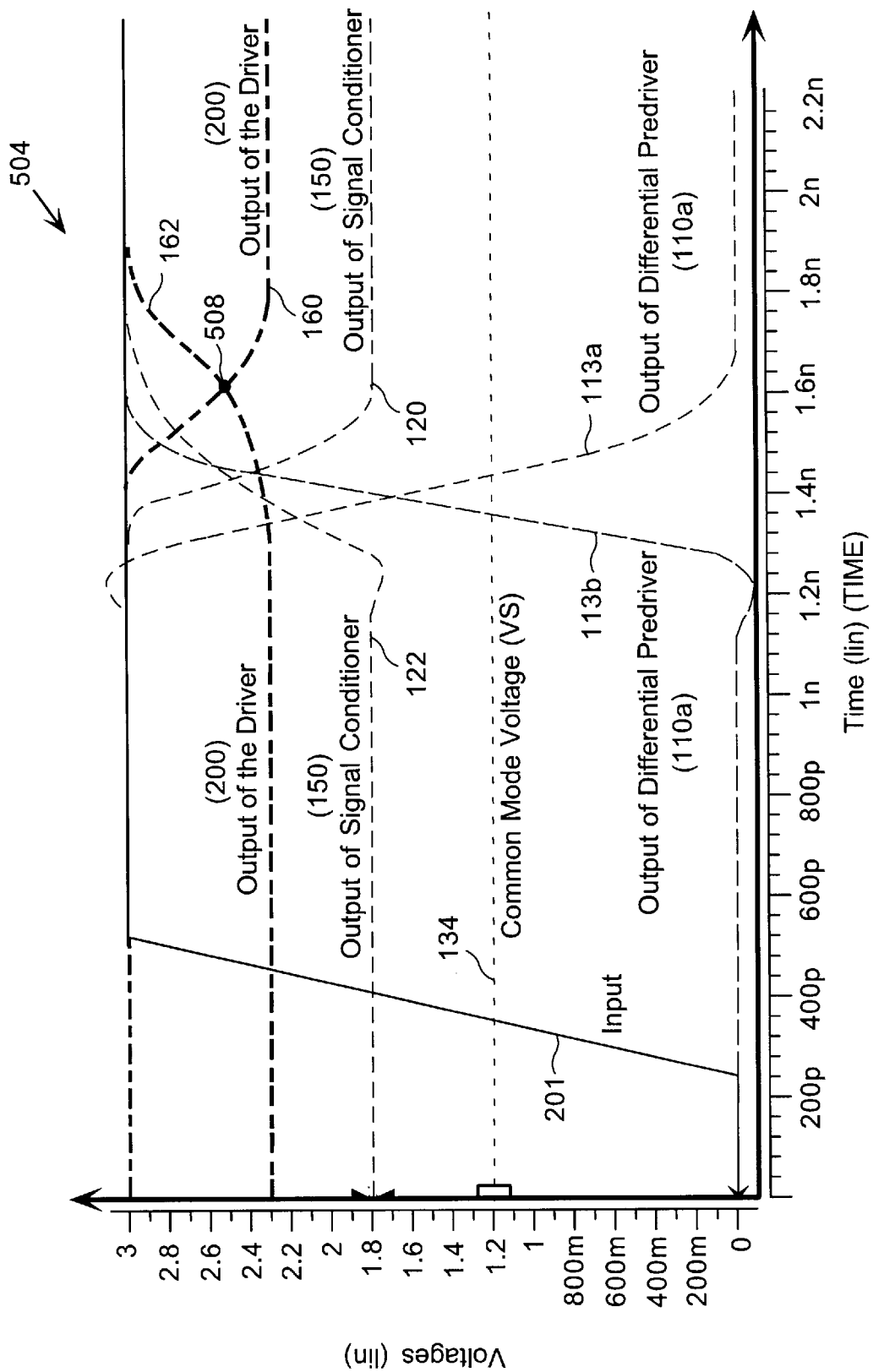
FIG. 5C illustrates the differential output voltage signals that are produced by the output driver of the high speed differential driver in accordance with one embodiment of the present invention.

As will be described below in greater detail, the output driver 110b is preferably well suited to take the reduced voltage swing produced by signals 120 and 122 to effectively produce output signals 160 and 162, which have a zero signal crossing, a 50% duty cycle, and equal rise and fall slew rates as shown in FIG. 5C.

Figure 3A:
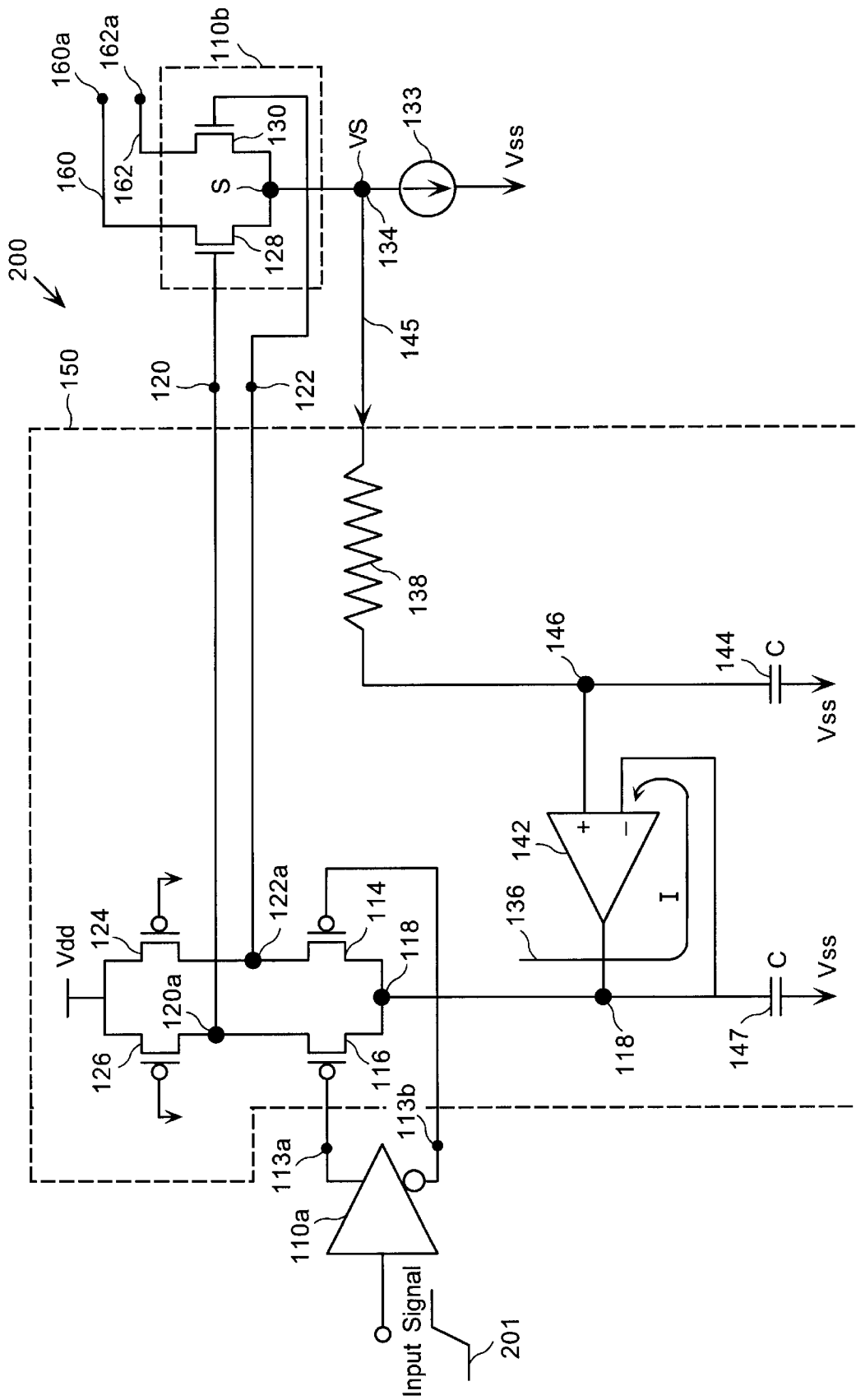
FIG. 3A is a more detailed circuit diagram of the high speed differential driver of FIG. 2 in accordance with one embodiment of the present invention.

FIG. 3A is a more detailed circuit diagram of the high speed differential driver 200 of FIG. 2 in accordance with one embodiment of the present invention. In this more detailed diagram, the differential pre-driver 110a is shown receiving the input signal 201 and producing the differential output signal 113a and 113b, which is coupled to a transistor 116 and a transistor 114, respectively. A terminal of transistor 116 is coupled to a terminal of a transistor 126 at a node 120a that supplies signal 120 as described above. In a like manner, a terminal of transistor 114 is connected to a terminal of a transistor 124 at a node 122a that supplies signal 122.

The gates of transistors 124 and 126 are shown coupled to ground (i.e., Vss), and the source terminals of transistors 124 and 126 are coupled to a power source (i.e., Vdd). Further, the drain terminals of transistors 114 and 116 are coupled to a node 118, that is coupled to an output of a unit gain voltage source 142. Node 118 is also coupled to a capacitor 147, which is coupled to Vss. In operation, transistors 114, 116, 124, and 126 function as a voltage divider, and a current 136 is preferably continuously produced through either transistors 124 and 114, or transistors 126 and 116, depending on the polarity of the signals 113a and 113b produced by the differential pre-driver 110a. Preferably, the continuous current 136 is well suited to prevent the unit gain voltage source 142 from self oscillation.

The positive node of the unit gain voltage source 142 is coupled to a node 146. Node 146 is shown coupled to a capacitor 144, which is also coupled to Vss. Between node 134 and node 146 lies a resistor 138 that completes a low pass filter for the feedback voltage signal 145 of Vs node 134. As can be appreciated, the signal conditioner circuitry 150 will produce voltage swings for signals 120 and 122 that are controllably reduced to advantageously force the output driver 110b to be more efficient in switching at high speeds. For example, signal 120 is shown coupled to a gate of a transistor 128 of the output driver 110b, and signal 122 is shown coupled to a gate of a transistor 130 of the output driver 110b. The source terminals of transistors 128 and 130 are coupled at a node S. Node S therefore provides a voltage Vs at the node 134.

Figure 3B:
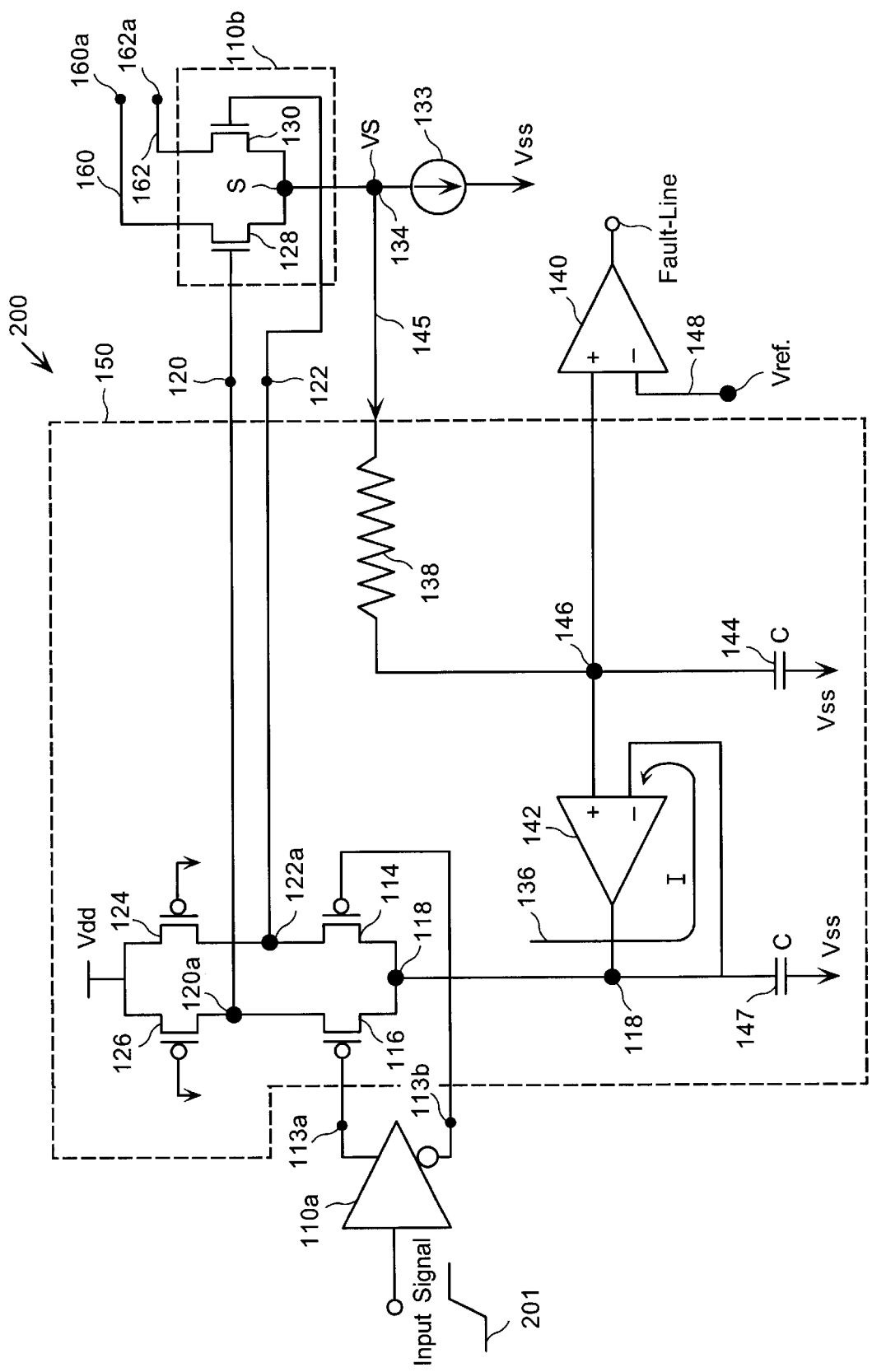
FIG. 3B shows a high speed differential driver in accordance with an alternative embodiment of the present invention.

FIG. 3B shows a high speed differential driver 200' in accordance with an alternative embodiment of the present invention. In this embodiment, a fault-line detector 140 may be included in systems to detect whether the twisted-pair cable 116 is still connected to the high speed differential driver 200'. By way of example, when the voltage Vs at node 146 drops below a reference voltage (V ref.), which is provided as a signal 148 to the fault-line detector 140, a fault-line signal will be produced. When the fault-line signal is produced, the high speed differential driver 200' will indicate that nodes 160a and 162a are no longer connected to the twisted-pair cable 116 (in FIG. 2).

Figure 3C:
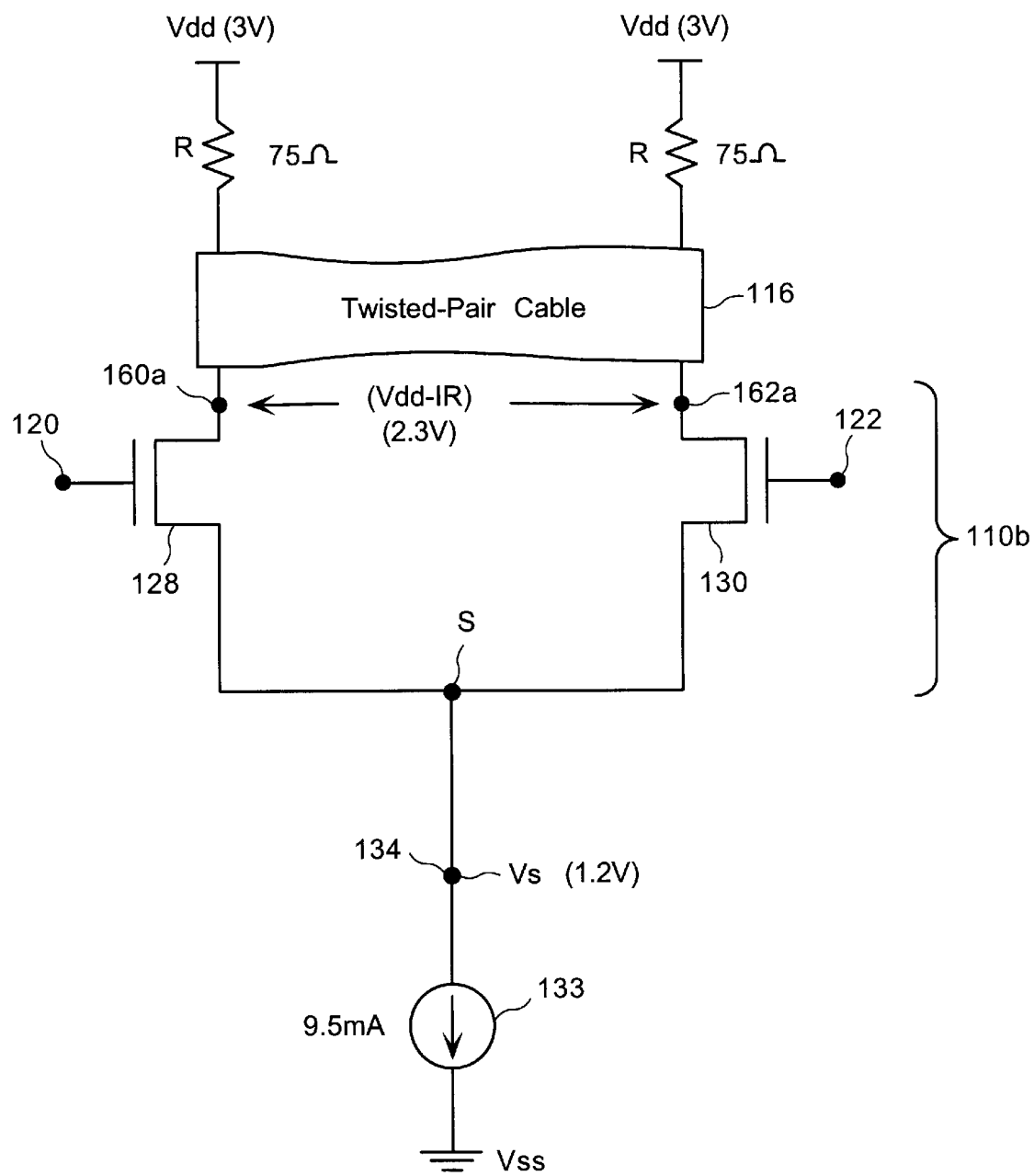
FIG. 3C shows a more detailed representation of an output driver of FIGS. 3A and 3B in accordance with one embodiment of the present invention.

FIG. 3C shows a more detailed representation of the output driver 110b of FIGS. 3A and 3B in accordance with one embodiment of the present invention. As shown, the drains (nodes 160a, 162a) of transistors 128 and 130 will have a voltage level of "Vdd–IR." The termination loads are shown to be 75 ohms, and the voltage source Vdd is shown to be 3 volts in accordance with the present example. Node S is likewise shown connected between the source terminals of transistors 128 and 130 which therefore, defines a voltage level Vs at node 134 (which is about 1.2 volts in this example).

As mentioned above, Vs is the common mode voltage, and the common mode voltage will change depending on the Vdd voltage supplied to the system, the size of the termination loads, and the size of the transistors 128 and 130. As mentioned above, the signal voltage levels 120 and 122 applied to the gates 128 and 130, respectively, are conditioned voltage levels that have a lower voltage swing than that of signals 113a and 113b (which are output from the differential pre-driver 110a).

Reference will now be made to FIGS. 3D and 3E which show exemplary voltage levels for the sources, drains and gates of transistors 128 and 130 of FIG. 3C. By way of example, in FIG. 3D, the transistor 128 will be ON when the gate of transistor 128 is provided with a signal voltage 120 of about 3 volts (i.e., Vdd). As mentioned above, node S is the common mode voltage which is set at about 1.2 volts, and the voltage at node 160a, which is the drain of transistor 128 is set at about 2.3 volts (after the voltage drop across the termination load R). The complementary differential signal 122 provided to the gate of transistor 130 will therefore shut OFF the transistor 130 with a voltage that is between about 2.3 volts and 1.2 volts. For example, transistor 130 will be OFF (weakly) when a voltage of about 2.3 volts or below is provided to the gate of transistor 130. Therefore, it will not be necessary to swing the voltage level provided at the gate of transistor 130 all the way to Vss. It should be noted that if the transistor is provided with a Vss voltage level, the transistor will be in deep turn off, thereby requiring more time to switch ON.

Advantageously, by not swinging the conditioned voltage signals 122 and 120 all the way to Vss, the output driver 110b will switch at a much faster rate than conventional devices. This is particularly useful for differential driver applications that are implemented in high speed data transmission applications.

FIG. 3E shows the case in which transistor 128 is placed in an OFF state, and transistor 130 is placed in an ON state. Accordingly, the conditioned voltage signals 120 and 122 applied to the gates of transistors 128 and 130, respectively, will rapidly switch transistor 128 OFF and transistor 130 ON. As in the case of FIG. 3D, the gate of transistor 130 is provided with a voltage signal 122 that is about 3 volts (i.e., Vdd), which places transistor 130 strongly ON.

However, transistor 128 is placed in an OFF state when the voltage drops from 3 volts down to a voltage level between 2.3 volts and 1.2 volts (i.e., 1.2 V is the common mode voltage Vs). Again, it should be noted that the voltage swing provided by the signal conditioner circuitry 150 of FIGS. 3A and 3B will enable the output driver 110b to rapidly switch and produce output signals 160 and 162 at the drains of transistors 128 and 130, respectively. Furthermore, the differential output signals 160 and 162 will have a zero signal crossing, a 50% duty cycle, and equal rise and fall slew rates. A graphical representation of the conditioned differential signals 120 and 122, and the resulting output signals 160 and 162 will be shown in greater detail in the graphs provided in FIGS. 5A through 5C below.

Figure 4A:
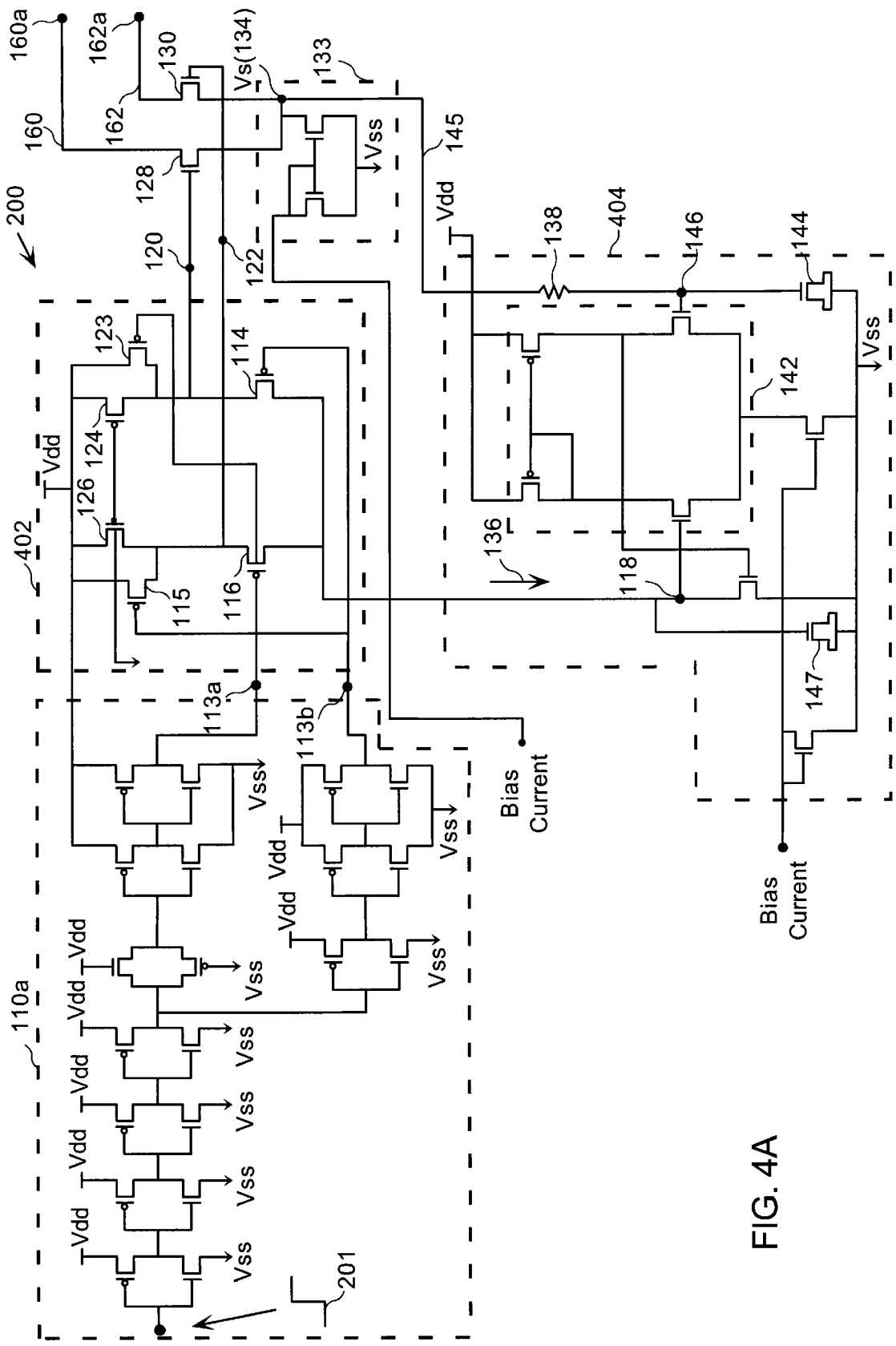
FIG. 4A is a transistor level circuit diagram of the high speed differential driver of FIG. 3A in accordance with one embodiment of the present invention.

FIG. 4A is a transistor level circuit diagram of the high speed differential driver 200 of FIG. 3A in accordance with one embodiment of the present invention. As shown, the differential pre-driver 110a is composed of a plurality of inverters, and pass gates, for generating the differential voltage signals 113a and 113b. Signals 113a and 113b are shown coupled to a voltage divider 402, that includes transistors 114, 116, 124, and 126, which were shown in FIGS. 3A and 3B above. In addition, transistors 115 and 123 are used, in one embodiment to provide a more rapid switch enhancement for the voltage divider 402.

The output of the voltage divider 402 is identified by the conditioned differential signals 120 and 122, which are respectively provided to the gates of transistors 128 and 130 of the output driver described above. Also shown is a current source 133 that is coupled to the feedback signal 145 and is passed through a low pass filter that includes a resistor 138 and a capacitor 144. In this transistor level representation, the capacitor 144 is actually a transistor that has its source and drain tied to ground, and the gate coupled to a node 146.

The circuitry of 404 also includes the unit gain voltage source 142, and capacitor 147, which is also a transistor having its drain and source tied to ground. As mentioned above, node 118 will therefore be supplied with a continuous current flow from either transistors 124 and 114, or alternatively, transistors 126 and 116 depending on the phase of the differential signals 113a and 113b. Further, the continuous current 136 is well suited to prevent the unit gain voltage source circuitry from oscillating.

Figure 4B:
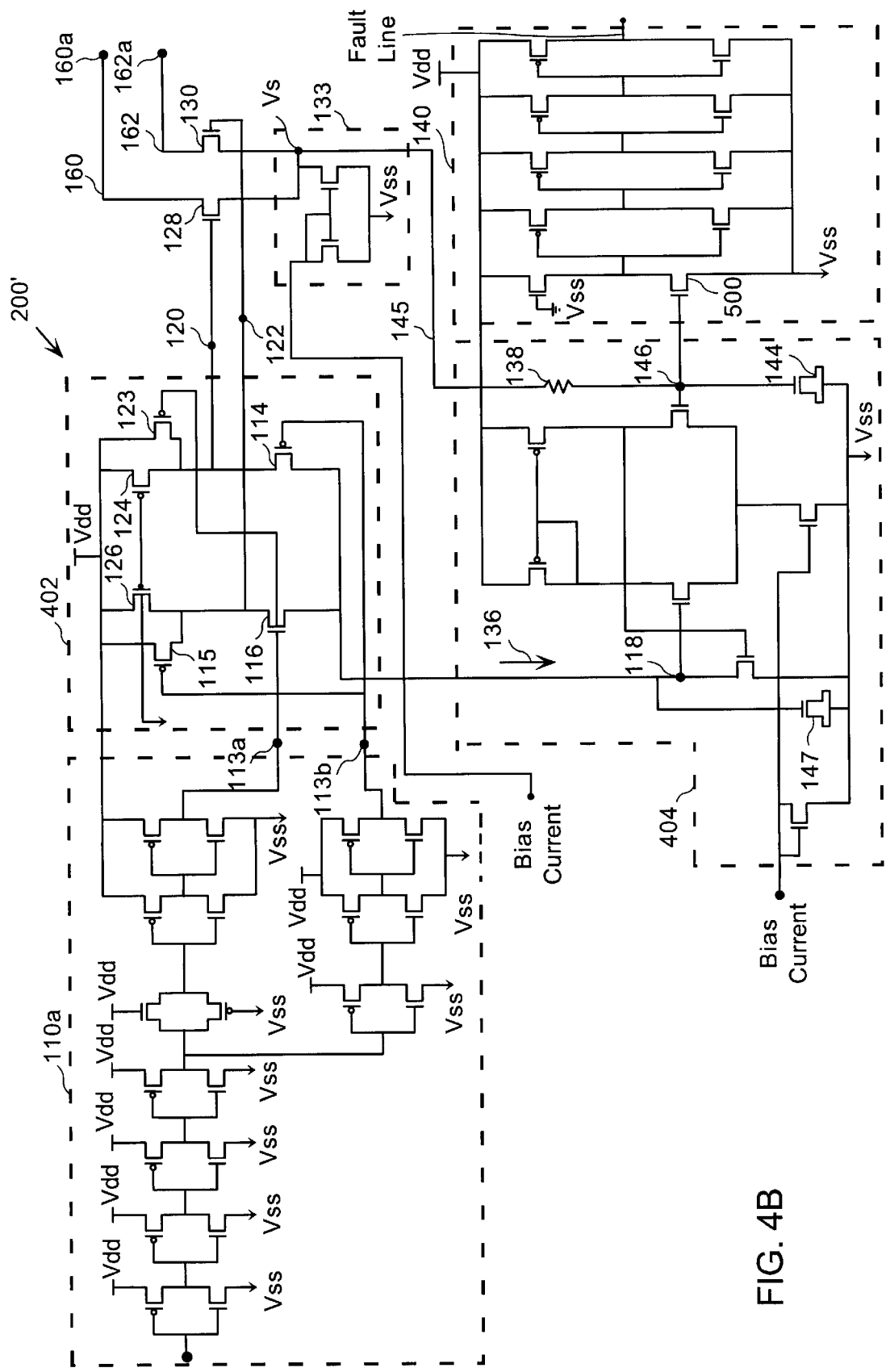
FIG. 4B is a transistor level representation of the high speed differential driver of FIG. 3B in accordance with an alternative embodiment of the present invention.

FIG. 4B is a transistor level representation of the high speed differential driver 200' of FIG. 3B in accordance with an alternative embodiment of the present invention. In this embodiment, the high speed differential driver 200' also includes fault detection circuitry 140 which is used to detect when the twisted-pair cable 116, that is coupled to nodes 160a and 162a becomes disconnected. As mentioned above, this will occur when the fault detection circuitry 140 determines that the voltage level at a node 146 drops below a reference voltage (i.e., transistor 500 turns off, thus bringing the "fault line" signal HI). The threshold voltage of transistor 500 therefore determines the reference voltage.

FIG. 5A is a graphical representation 500 of the input signal 201 and differential voltage signals 113a and 113b in accordance with one embodiment of the present invention. As mentioned above, voltage signals 113a and 113b will swing between Vss and Vdd, and are provided as inputs to the signal conditioner circuitry 150 as shown in FIG. 2 above.

FIG. 5B shows a graphical representation 502 of the voltage level at a node 134 for the common mode voltage (Vs), which is set in this example to be about 1.2 volts. As mentioned above, the actual voltage level of the common mode voltage is highly dependent on the loads that are provided at the output driver 110b and the termination loads of the twisted-pair cable 116. Therefore, 1.2 volts should only be considered as an exemplary common mode voltage for this discussion. Also shown in graph 502, are the conditioned differential signals 120 and 122 that are provided to the output driver 110b.

As mentioned above, the output of the signal conditioner 150 will not swing between Vdd and Vss, but alternatively will swing between Vdd and a lower voltage (i.e., an intermediate voltage) that sufficiently places the complementary transistor of the output driver 110b in an OFF state.

As shown in this example, a voltage of about 1.8 volts defines the lower swing voltage for the output of the signal conditioner circuitry 150. In addition, it is important to note that the lower voltage lies between 2.3 volts, which is the voltage at the drain of the transistors in the output driver 110b (i.e., Vdd−IR), and the common mode voltage Vs, which is about 1.2 volts. As shown in the tables of FIGS. 3D and 3E above, a voltage of about 1.8 volts will sufficiently place the complementary transistors of the output driver 110b in an OFF state when its complementary transistor is ON, and vice versa.

FIG. 5C illustrates the output signals 160 and 162 (in voltage form) that are produced by the output driver 110b of the high speed differential driver 200/200' in accordance with one embodiment of the present invention. It should now be appreciated that output signals 160 and 162 will have a zero signal crossing at a point 508, a 50% duty cycle, and equal rise and fall slew rates. As mentioned above, this is particularly advantageous for high speed systems to prevent lags in the receiver, which may slow down a data transmission operation.

Although the foregoing invention has been described in some detail for purposes of clarity of understanding, it will be apparent that certain changes and modifications may be practiced within the scope of the appended claims. The exemplary embodiments were shown to reference against 3.3V, however, a circuit can also be shown to reference against ground. When this is the case, the load (cable and resistance) is connected between the ground "GND" and the output of the differential driver. The voltage across the load is between the "GND" and I * R (current * resistance). It should therefore be understood that the various circuit diagrams may be embodied in any form which may include, for example, any suitable semiconductor substrate, printed circuit board, packaged integrated circuit, or software implementation. Accordingly, the present embodiments are to be considered as illustrative and not restrictive, and the invention is not to be limited to the details given herein, but may be modified within the scope and equivalents of the appended claims.

What is claimed is:

1. An integrated circuit driver for driving an input signal, comprising:

a differential pre-driver being configured to produce an amplified differential signal from the input signal having an about 50% duty cycle, the amplified differential signal being configured to swing between a power rail level and a ground level;

a signal conditioner circuit being configured to receive the amplified differential signal and output a conditioned differential signal, the signal conditioner circuit comprising a unit gain voltage source, the conditioned differential signal being configured to swing between the power rail level and an intermediate power level; and an output driver being configured to receive the conditioned differential signal that swings between the power rail level and the intermediate power level, the output driver comprising a feedback line that communicates a common mode voltage of the output driver back to the signal conditioner circuit, the output driver producing a differential output signal that is communicated to a communication cable;

whereby the differential output signal has an about zero signal crossing and maintains an about fifty percent duty cycle.

2. An integrated circuit driver for driving an input signal as recited in claim 1, wherein the differential output signal is driven over a twisted-pair cable or a twin-x shielded cable.

3. An integrated circuit driver for driving an input signal as recited in claim 1, wherein the common mode voltage lies substantially below the intermediate power level.

4. An integrated circuit driver for driving an input signal as recited in claim 3, wherein the intermediate power level lies between the common mode voltage and a drain voltage of the output driver, the drain voltage being equal to a voltage of the power rail level−I(current)×R (load).

5. An integrated circuit driver for driving an input signal as recited in claim 4, wherein the output driver further includes a first transistor and a second transistor, and a source of both the first transistor and the second transistor are coupled together to define the common mode voltage.

6. An integrated circuit driver for driving an input signal as recited in claim 4, wherein the differential output signal swings between the power rail level and the drain voltage of the output driver.

7. An integrated circuit driver for driving an input signal as recited in claim 6, wherein the signal conditioner circuit further includes:

a voltage divider that is configured to receive the amplified differential signal, the voltage divider begin coupled between the power rail level and a filtered common mode voltage.

8. An integrated circuit driver for driving an input signal as recited in claim 7, wherein the voltage divider is configured to output the conditioned differential signal that swings between the power rail level and the intermediate power level.

9. An integrated circuit driver for driving an input signal as recited in claim 8, wherein the conditioned differential signal causes the output driver to produce the differential output signal at output nodes.

10. An integrated circuit driver for driving an input signal as recited in claim 7, wherein the signal conditioner circuit further includes:

a low pass filter for filtering the common mode voltage; and the unit gain voltage source that produces the filtered common mode voltage.

11. An integrated circuit driver for driving an input signal, comprising:

a differential pre-driver being configured to produce an amplified differential signal from the input signal having an about 50% duty cycle, the amplified differential signal being configured to swing between a power rail level and a ground level;

a signal conditioner circuit being configured to receive the amplified differential signal and output a conditioned differential signal, the conditioned differential signal being configured to swing between the power rail level and an intermediate power level; and an output driver being configured to receive the conditioned differential signal that swings between the power rail level and the intermediate power level, the output driver comprising a feedback line that communicates a common mode voltage of the output driver back to the signal conditioner circuit, the common mode voltage being substantially below the intermediate power level and the intermediate power level being between the common mode voltage and a drain voltage of the output driver, the drain voltage being equal to a voltage of the power rail level−I (current)×R (load), the output driver producing a differential output signal that is communicated to a communication cable;

whereby the differential output signal has an about zero signal crossing and maintains an about fifty percent duty cycle.

12. A method for driving a signal over a communication link, comprising:

receiving the signal that is to be communicated over the communication link, the signal having an about 50% duty cycle;

differentially driving the signal to produce a differential signal that swings between a high voltage level and a ground voltage level;

conditioning the differential signal to produce a conditioned differential signal that swings between the high voltage level and an intermediate voltage level that is above the ground voltage level, the conditioning including passing the differential signal through a signal conditioner circuit comprising a unit gain amplifier; and differentially driving the conditioned differential signal in an output driver to produce an output differential signal that has an about zero signal crossing and maintains an about fifty percent duty cycle the, output driver comprising a feedback line that communicates a feedback voltage signal back to the signal conditioner circuit.

13. A method for driving a signal over a communication link as recited in claim 12, wherein the communication link is a twisted-pair cable or a twin-x shielded cable.

14. A method for driving a signal over a communication link as recited in claim 13, wherein the signal conditioner circuit further includes a voltage divider circuit that is configured to receive the differential signal and the feedback voltage signal, and then output the produced conditioned differential signal to the output driver.

15. A method for driving a signal over a communication link as recited in claim 14, wherein the feedback voltage signal is a common mode voltage of the output driver, and the feedback voltage signal is filtered in the signal conditioner circuit.

16. A method for driving a signal over a communication link as recited in claim 15, wherein the feedback voltage is signal passed through the unit gain amplifier that lies within the signal conditioner circuit after the feedback voltage signal is filtered.

17. A method for driving a signal over a communication link as recited in claim 12, wherein the intermediate voltage level lies between a common mode voltage and a drain voltage that is the high voltage level minus a current multiplied by a load of the communication link.

18. A system for differentially driving a signal over a twisted-pair cable, comprising:

means for differentially driving a signal having an about 50% duty cycle to produce a differential signal that swings between a high voltage level and a ground voltage level;

means for conditioning the differential signal to produce a conditioned differential signal that swings between the high voltage level and an intermediate voltage level that is above the ground voltage level, the means for conditioning the differential signal comprising a unit gain voltage source; and means for differentially driving the conditioned differential signal to produce an output differential signal that has an about zero signal crossing and maintains an about fifty percent duty cycle, the means for differentially driving the conditioned differential signal comprising an output driver having a feedback line that communicates a common mode voltage of the output driver back to the means for conditioning the differential signal.

19. A system for differentially driving a signal over a twisted-pair cable as recited in claim 18, wherein the means for conditioning the differential signal includes a voltage dividing means that is configured to receive the differential signal and the common mode voltage, and then output the produced conditioned differential signal to the output driver.

* * * * *